United States Patent
Fujiyama et al.

(10) Patent No.: US 8,151,238 B2
(45) Date of Patent: Apr. 3, 2012

(54) SEMICONDUCTOR INTEGRATED CIRCUIT AND DESIGN METHOD THEREOF

(75) Inventors: Kouji Fujiyama, Osaka (JP); Takahiro Nagatani, Kyoto (JP); Atsushi Takahashi, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/943,549

(22) Filed: Nov. 10, 2010

(65) Prior Publication Data

US 2011/0057320 A1  Mar. 10, 2011

Related U.S. Application Data

(62) Division of application No. 11/594,750, filed on Nov. 9, 2006, now Pat. No. 7,855,579.

(30) Foreign Application Priority Data

| Nov. 25, 2005 | (JP) | ................................. 2005-339684 |
| Jun. 5, 2006 | (JP) | ................................. 2006-156490 |

(51) Int. Cl.
- *G06F 17/50* (2006.01)
- *G06F 9/455* (2006.01)
- *H01L 25/00* (2006.01)
- *H01L 27/118* (2006.01)
- *H01L 23/52* (2006.01)

(52) U.S. Cl. ........ 716/127; 716/126; 716/130; 716/133; 326/41; 257/202; 257/207

(58) Field of Classification Search .................. 257/202, 257/207; 326/41; 716/100, 120, 126–127, 716/130, 133
See application file for complete search history.

(56) References Cited

U.S. PATENT DOCUMENTS

| 5,648,910 | A |  | 7/1997 | Ito |
| 5,972,740 | A |  | 10/1999 | Nakamori |
| 6,477,687 | B1 |  | 11/2002 | Thomas |
| 6,480,989 | B2 |  | 11/2002 | Chan et al. |
| 6,625,792 | B1 | * | 9/2003 | Yamasaki ..................... 716/122 |
| 6,687,133 | B1 |  | 2/2004 | Liew et al. |
| 6,809,419 | B2 |  | 10/2004 | Minami et al. |
| 6,868,374 | B1 |  | 3/2005 | Ditlow et al. |
| 6,888,395 | B2 |  | 5/2005 | Mizuno et al. |
| 7,103,863 | B2 | * | 9/2006 | Riepe et al. ................... 716/113 |

(Continued)

FOREIGN PATENT DOCUMENTS

| JP | 7-283378 A | 10/1995 |
| JP | 2003-318260 A | 11/2003 |
| JP | 2004-111796 | 4/2004 |

OTHER PUBLICATIONS

U.S. Notice of Allowance issued in U.S. Appl. No. 11/594,750, mailed on Aug. 20, 2010.

*Primary Examiner* — Stacy Whitmore
(74) *Attorney, Agent, or Firm* — McDermott Will & Emery LLP

(57) ABSTRACT

In a layout process of a semiconductor integrated circuit, a power supply is initially formed in an arrangement in which the current threshold value is not exceeded. In a case where the excess over the current threshold value occurs after the power supply is formed, the power supply arrangement is changed according to the current threshold value, design rule data base, and power supply wiring density so as not to exceed the current threshold value.

20 Claims, 11 Drawing Sheets

U.S. PATENT DOCUMENTS

| | | |
|---|---|---|
| 7,129,574 B2 | 10/2006 | Wu |
| 7,199,472 B2 | 4/2007 | Minami et al. |
| 7,230,477 B2 | 6/2007 | Mizuno et al. |
| 2003/0052341 A1* | 3/2003 | Iwao .............................. 257/207 |
| 2004/0041268 A1 | 3/2004 | Montagnana |
| 2005/0160391 A1 | 7/2005 | Orita |
| 2005/0289494 A1 | 12/2005 | Kozhaya et al. |
| 2006/0093129 A1* | 5/2006 | Redorta et al. ................ 379/413 |

* cited by examiner

US 8,151,238 B2

SEMICONDUCTOR INTEGRATED CIRCUIT AND DESIGN METHOD THEREOF

RELATED APPLICATIONS

This application is a Divisional of U.S. patent application Ser. No. 11/594,750, filed on Nov. 9, 2006, now U.S. Pat. No. 7,855,579 claiming priority of Japanese Application No. 2005-339684, filed on Nov. 25, 2005 and Japanese Application No. 2006-156490, filed on Jun. 5, 2006, the entire contents of each of which are hereby incorporated by reference.

BACKGROUND OF THE INVENTION

The present invention relates to a power supply structure and a power supply design method of a semiconductor integrated circuit for specifying a part where electromigration (EM) may occur and for reducing the incidence of EM in a layout process of the semiconductor integrated circuit having a multilayer interconnection configuration.

Conventionally, in a power supply design in a layout process of a semiconductor integrated circuit, a ring power supply may be formed of a pair of power supply VDD and ground VSS positioned such that the pair of power supply VDD and ground VSS are surrounded by IO terminals. In this case, in order to simplify a wire arrangement process, one layer is used in a vertical direction and another layer is used in a horizontal direction.

FIG. 1 shows ring power supplies and a power supply wiring arrangement between an IO and the ring power supplies of a conventional semiconductor integrated circuit. Referring to FIG. 1, ring power supplies 3 and 4 are positioned such that the ring power supplies 3 and 4 are surrounded by an IO terminal region 1. The vertical direction ring power supplies 3 and the horizontal direction ring power supplies 4 are connected each other by vias (contacts) 5. Here, the inner ring is designated as VDD and the outer ring is designated as VSS. However, VDD and VSS may be reversed. In order to avoid a short circuit, a layer of a power supply wire 7 connecting the vertical direction ring power supply 3 with a power supply (VDD) terminal 2 is formed of a layer different from a layer of the vertical direction ring power supply 3. Likewise, in order to avoid a short circuit, a layer of a power supply wire 6 connecting the horizontal direction ring power supply 4 with another power supply (VDD) terminal is formed of a layer different from a layer of the horizontal direction ring power supply 4.

In FIG. 1, the layer of the vertical direction ring power supply is designated, for example, as Mx, and the layer of the horizontal direction ring power supply is designated, for example, as Mx–1. In this case, in order to avoid a short circuit, the power supply wire 7 connected between the IO and the vertical direction ring power supply (Mx) is the layer designated as Mx–1, and the power supply wire 6 connected between the IO and the horizontal direction ring power supply (Mx–1) is the layer designated as Mx.

As to the current threshold value of each layer, an upper layer generally has a current threshold value higher than that of a lower layer (Mx>Mx–1). Therefore, the power supply wire through which the greatest magnitude of current flows between the IO and the ring power supply must be the upper layer. Otherwise, a current exceeding the current threshold value flows through the power supply wire. Consequently, EM may occur which causes breaking of wire (In FIG. 1, a critical part where breaking of wire may occur is indicated by reference number 7).

In order to cope with this problem, following measures against EM have been taken: broadening the width of a wire between the IO and the ring power supply, and increasing the number of vias.

Meanwhile, the maximum wire width of each layer reduces as process miniaturization advances. Therefore, a plurality of thin power supplies are generally arranged in mesh form. Considering the worker-hour, it has been common that a mesh power supply and a strap power supply have a constant pitch (see Japanese Laid-Open Patent Publication No. 7-283378).

In this case, an arrangement position of a macro, a power supply arrangement inside the macro or the like causes a part to where a sufficient number of contacts can not be provided. Also in such case where the sufficient number of contacts can not be provided, the current threshold value of the via is exceeded. Consequently, the possibility of the EM incidence increases.

To cope with the problem, it has been proposed that the via is provided with a reservoir as a measure against EM (see Japanese Laid-Open Patent Publication No.

In recent years, semiconductor process miniaturization has been rapidly increasing the number of circuits (functions) integrated on a chip. However, decrease in the number of terminals is slower than increase in circuit integrity resulting from the process miniaturization. Therefore, the number of cases is increasing that the number of terminals determines the chip size.

In many cases, the number of power supply terminals is reduced in order to reduce the total number of terminals. When the number of power supply terminals is reduced, problems arise such as voltage drop and EM.

SUMMARY OF THE INVENTION

An object of the present invention is to provide a power supply arrangement reducing the incidence of EM and to reduce the worker-hour required for producing the power supply arrangement.

To achieve the above-mentioned object, according to the first invention, a power supply wire is formed in a layout step for a semiconductor integrated circuit such that the power supply wire between an IO and the ring power supply is initially formed of a top layer (Mx), and in a case where a part of the power supply wire forms a short circuit with the ring power supply, the ring power supply is formed of a layer (Mx–1) which is one level lower than the top layer.

According to the second invention, a power supply wire is formed in a layout step for a semiconductor integrated circuit such that a pair of ring power supplies VDD and VSS are crossed at a corner, and a power supply IO is positioned at the corner, so that the power supply wire between the IO and the ring power supplies is formed of a top layer (Mx) without changing the conventional arrangement of the ring power supply. Note that, it is the current value that determines whether or not the power supply wire is formed of the top layer.

In the third invention, a means for evenly supplying power to a semiconductor circuit is further provided to the arrangement according to the above-mentioned second invention.

According to the fourth invention, a power supply wire is formed in a layout step for a semiconductor integrated circuit such that the power supply wire from a power supply IO is branched into a plurality of wires and connected to a ring power supply so as to uniformly distribute the current density.

According to the fifth invention, in the fourth invention, the power supply wire between the power supply IO and the ring power supply is formed of a plurality of wire layers and the plurality of wire layers are connected by vias so as to more uniformly distribute the current density compared with the fourth invention.

According to the sixth invention, a power supply wire is formed in a layout step for a semiconductor integrated circuit such that a plurality of adjacent power supply wires having the same potential may be used to connect a power supply IO with a ring power supply, and in this case, the adjacent power supply wires having the same potential are arranged in mesh form so as to uniformly distribute the current density.

According to the seventh invention, in the sixth invention, the power supply wire between the power supply IO and the ring power supply is formed of a plurality of wire layers and the plurality of wire layers are connected by vias so as to more uniformly distribute the current density compared with the fourth invention.

The eighth invention is a combination of the fourth invention and the sixth invention.

According to the ninth invention, in the eighth invention, the power supply wire between the power supply IO and the ring power supply is formed of a plurality of wire layers and the plurality of wire layers are connected by vias so as to more uniformly distribute the current density compared with the fourth invention.

The tenth invention is to provide a method for changing a power supply arrangement so as not to exceed the current threshold value, in a case where a ring power supply and a power supply wire between an IO and the ring power supply are formed, for example, in a conventional arrangement, and the current threshold value is exceeded in a part of the power supply wire.

The eleventh invention is to provide a method for preventing the occurrence of EM. In the method, a power supply wire is first formed in a power supply wire formation step, and then the current threshold value is checked. In a case where there is a possibility of the excess over the current threshold value due to the number and shape of contacts on the power supply wire, an appropriate number and shape of contacts are chosen. Forming contacts in this manner prevents the occurrence of EM.

The twelfth invention is to provide a method for preventing the excess over the current threshold value. In the method, a power supply and a contact are initially formed in a power supply forming step, and then a power supply arrangement in a macro, IP or the like is connected with a constant pitch power supply arrangement of a chip. In connecting the power supply arrangement and the constant pitch power supply arrangement, there may be a possibility that the excess over the current threshold value occurs due to a contact formed unintentionally. In such case, the number of vias is changed or an unnecessary via is deleted in the part having the possibility of the excess over the current threshold value.

The thirteenth invention is to provide a method for detecting a region in which a sufficient number of contacts can be formed and the sufficient number of contacts does not cause the excess over the current threshold value, and in a case where the same situation occurs as in the twelfth invention, instead of correcting the number of contacts, changing a position of a constant pitch power supply of a chip.

The fourteenth invention is to provide a method for changing the wire width, wire length or layer of a current threshold value exceeding part of the wire so as not to exceed the current threshold value, and to reduce the possibility of the incidence of EM, in a case where application of methods described in the eleventh through thirteenth inventions does not eliminate a current threshold value exceeding part of the wire.

According to a method of the fifteenth invention, in the tenth invention, a position or width of the wire is changed so as not to exceed the predetermined wiring density.

The ring power supply and the wiring arrangement between the IO and the ring power supply of the semiconductor integrated circuit according to the first invention allows significant reduction of the incidence of EM at a part through which the greatest magnitude of current flows. Moreover, the arrangement does not involve area damage, such as increase in the number of wires.

According to the second invention, it is possible for a wire layer between the IO and the ring power supply to be formed of a layer having a high current threshold value without changing the conventional ring power supply arrangement. Therefore, it is not necessary to change the layer of the ring power supply and the total number of vias decreases. Consequently it is possible to avoid a jam of wires.

According to the third invention, it is possible to evenly supply power to a semiconductor integrated circuit while EM is reduced and a jam of wires is avoided.

According to the fourth invention, it is possible to uniformly distribute the current density at a part at which a wire from the power supply IO is connected with the ring power supply, and to reduce the incidence of EM.

According to the fifth invention, a part at which a wire from the power supply IO is connected to the ring power supply is lined with a plurality of layers so as to uniformly distribute the current density. Therefore, the fifth invention is possible to reduce the incidence of EM more than the fourth invention reduces the incidence of EM.

According to the sixth invention, adjacent wires having the same potential may be used, and in this case, these adjacent wires are connected in mesh form between the power supply IO and the ring power supply so as to uniformly distribute the current density. Therefore, the sixth invention is possible to reduce the incidence of EM more than the fourth invention reduces the incidence of EM.

According to the seventh invention, a part at which a wire from the power supply IO is connected to the ring power supply is lined with layers. Therefore, the seventh invention is possible to reduce the incidence of EM more than the sixth invention reduces the incidence of EM.

According to the eighth invention, the current density on a part of a wire connected to the ring power supply and on the wire between the power supply IO and the ring power supply is uniformly distributed. Therefore, the eighth invention is possible to reduce the incidence of EM more than the fourth and sixth inventions reduce the incidence of EM.

According to the ninth invention, a part at which a wire from the power supply IO is connected to the ring power supply is lined with layers. Therefore, the ninth invention is possible to reduce the incidence of EM more than the eighth invention reduces the incidence of EM.

According to the tenth invention, it is possible to reduce the worker-hour required for the subsequent steps of, for example, correcting the power supply incompliant with the current threshold value and rearranging the wires.

According to the eleventh invention, a part having a high possibility of the EM incidence is previously specified, and a measure is taken to the part, so that it is possible to reduce the worker-hour required for the subsequent steps of, for example, correcting the power supply incompliant with the current threshold value, and rearranging the wires as well as reducing EM.

According to the twelfth invention, a part incompliant with the current threshold value caused by a layout change is specified, and a measure is taken to the part, so that it is possible to reduce the worker-hour required for the steps of, for example correcting the power supply, and rearranging the wires as well as reducing EM.

According to the thirteenth invention, it is possible to reduce the worker-hour required, for example, for reducing EM, for improving power supply to a macro, IP or the like, for the subsequent steps of correcting the power supply incompliant with the current threshold value, and rearranging the wires.

According to the fourteenth invention, it is possible to reduce the worker-hour required, for example, for reducing EM, for improving power supply to a macro, IP or the like, for the subsequent steps of correcting the power supply incompliant with the current threshold value, and rearranging the wires.

In the conventional art, a specification for the wiring density is checked in a subsequent step. However, according to the fifteenth invention, the specification is checked in advance. Consequently, a repeat step is omitted.

DESCRIPTION OF THE PREFERRED EMBODIMENTS

Figure 1:
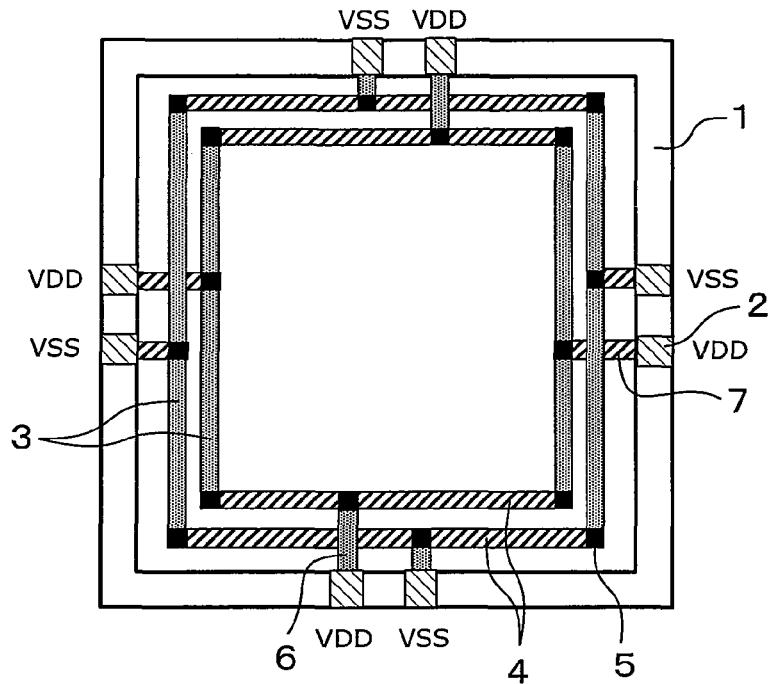
FIG. 1 is a plan view illustrating a ring power supply arrangement in a semiconductor integrated circuit in conventional art.
Figure 2:
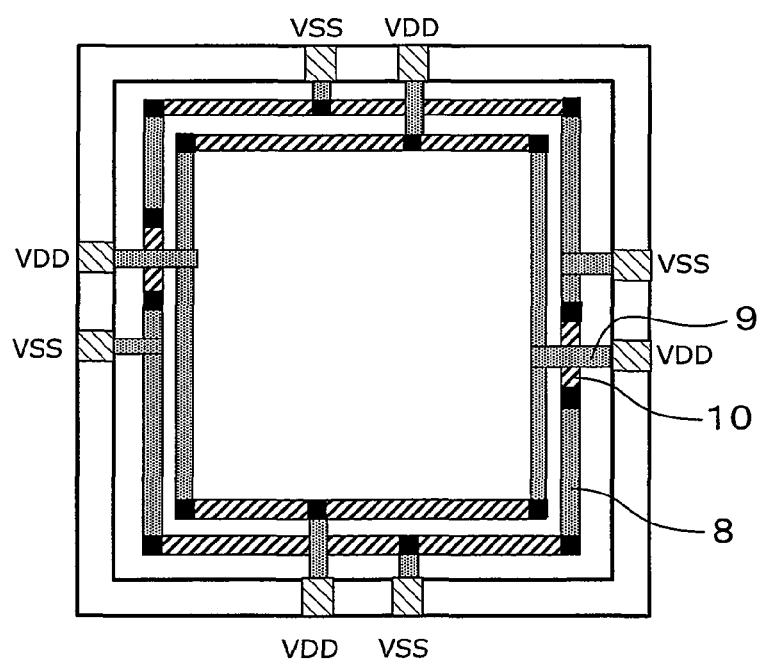
FIG. 2 is a plan view illustrating an example of a ring power supply arrangement in a semiconductor integrated circuit according to the invention.

FIG. 2 shows a ring power supply and a power supply wiring arrangement between an IO and the ring power supply according to the present invention. Compared with the conventional art arrangement shown in FIG. 1, the power supply wire 7 running between the IO and the ring power supply, which is the layer (Mx−1) in FIG. 1, is replaced with a power supply wire 9 running between the IO and the ring power supply, which is the upper layer (Mx). Moreover, in order to avoid a short circuit between a ring power supply 8 of the upper layer (Mx) and the power supply wire 9 running between the IO and the ring power supply, a part 10 of the ring power supply 8 susceptible to a short circuit is changed to the layer Mx−1.

According to the arrangement shown in FIG. 2, a part 9 having the largest current value between the IO and the ring power supply can be formed of the upper layer having a high current threshold value. This arrangement achieves the effect of reducing the incidence of EM.

Figure 3:
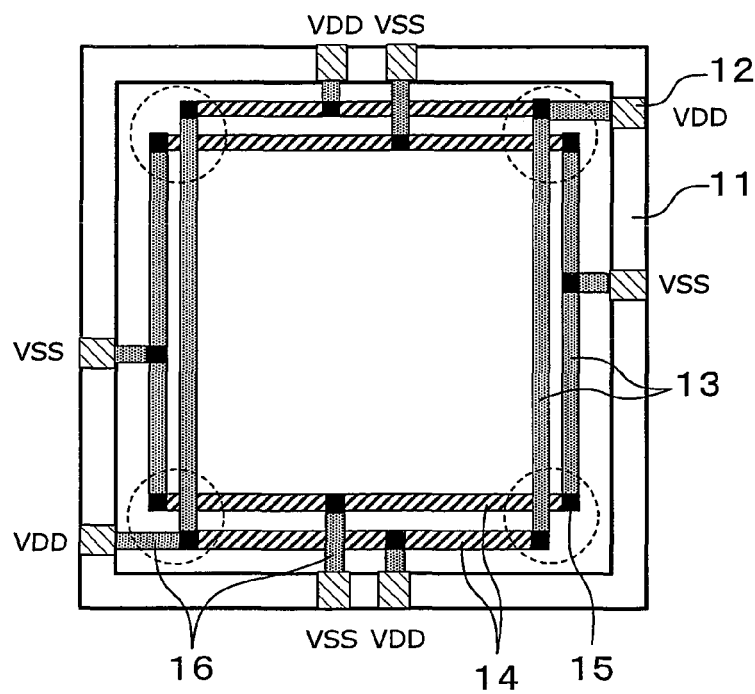
FIG. 3 is a plan view illustrating another example of a ring power supply arrangement according to the invention.

FIG. 3 shows another example of a ring power supply arrangement according to the present invention. FIG. 3 shows an IO terminal region 11, power supply terminals 12, VDD/VSS metal ring power supplies (Mx) 13, VDD/VSS metal ring power supplies (Mx−1 or Mx+1) 14, vias (contacts) 15 connecting the VDD/VSS metal ring power supplies (Mx) 13 with the VDD/VSS metal ring power supplies (Mx−1 or Mx+1) 14, and power supply wires (Mx) 16 connecting the power supply terminals with the metal ring power supplies. Compared with the conventional arrangement shown in FIG. 1, in the arrangement in FIG. 3, the ring power supplies 13 and 14 of VDD and VSS are crossed at a corner (circulated by broken line). In this case, VDD comes outside in a horizontal direction wiring part, and VSS comes outside in a vertical direction wiring part. Now, vertical wires 13 of the ring power supply are formed of a top layer (Mx), and horizontal wires 14 of the ring power supply are formed of a layer (Mx−1) which is one level lower than the top layer (Mx). VDD and VSS may be reversed.

According to the arrangement shown in FIG. 3, the ring power supplies 13 and 14 have a step (level difference) at a corner. The power supply terminal 12 is positioned such that the power supply terminal 12 aligns with the step at the corner. In this arrangement, the wire 16 having the highest current value between the IO and the ring power supply can be formed of the top layer (although it is the current value that determines whether or not the wire is formed of the top layer). Consequently, this arrangement achieves the effect of reducing the incidence of EM.

Figure 4:
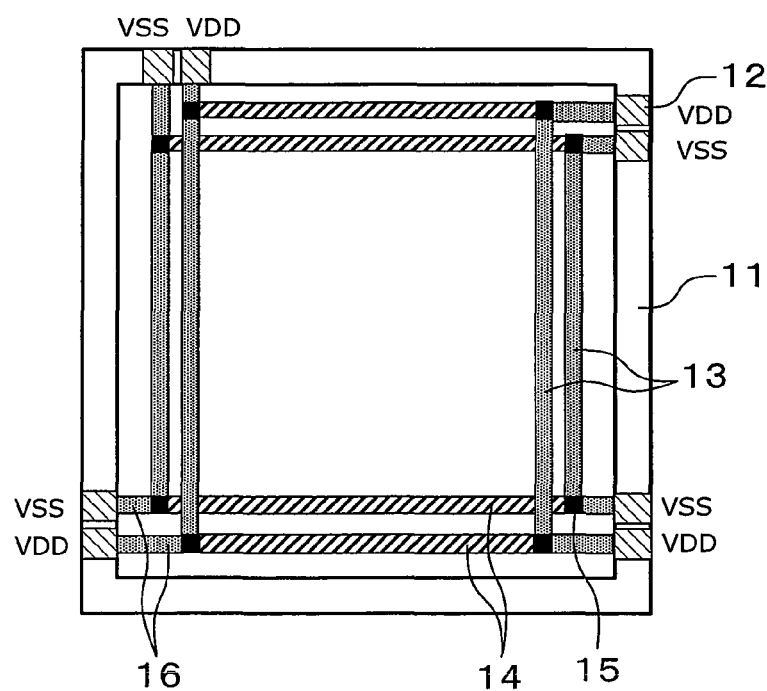
FIG. 4 is a plan view illustrating still another example of a ring power supply arrangement according to the invention.

FIG. 4 shows still another example of a ring power supply arrangement according to the present invention. In FIG. 4, the power supply terminals 12 for VDD and VSS are positioned such that each of the power supply terminals 12 aligns with the step at each corner of the ring power supplies 13 and 14. In this arrangement, power is supplied from four corners of a chip. Therefore, it is possible to evenly supply power to a semiconductor integrated circuit, while the wire 16 between the IO and the ring power supply remains to be the top layer.

FIGS. 5-10 are enlarged views illustrating techniques used to improve the power supply wire 7 connecting the power supply terminal 2 with the horizontal direction ring power supply 3 at the left side in FIG. 1.

Figure 5:
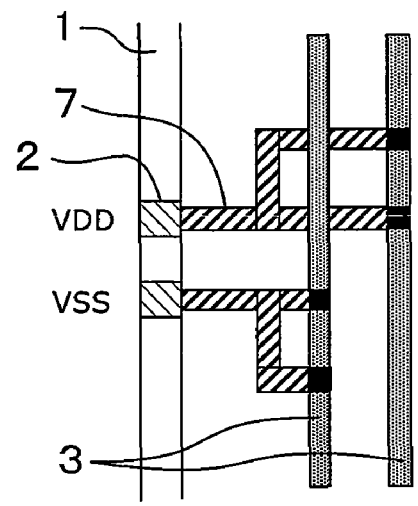
FIG. 5 is an enlarged plan view illustrating still another example of a ring power supply arrangement according to the invention.

In FIG. 5, a wire from the power supply IO is branched into two wires. In FIG. 5, the power supply IO is connected with the ring power supply in one-to-two manner instead of one-to-one manner. That is, in this arrangement, a current flow path is branched. In this arrangement, it is possible to prevent concentration of the current flow on the ring power supply and to uniformly distribute the current flow. Consequently, the incidence of EM is reduced.

Figure 6:
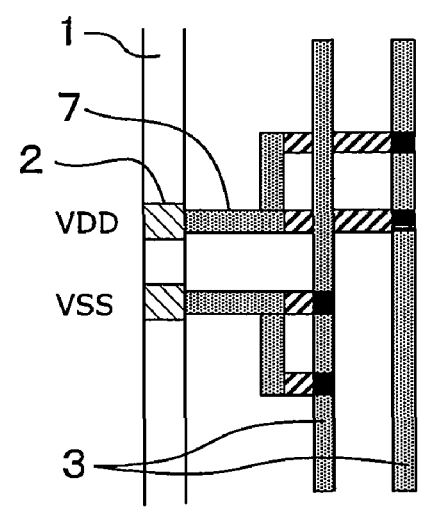
FIG. 6 is an enlarged plan view illustrating still another example of a ring power supply arrangement according to the invention.

In FIG. 6, the wire between the power supply IO and the ring power supply shown in FIG. 5 is lined with layers. This improves the threshold current density of the wire connected between the power supply IO and the ring power supply. Consequently, the incidence of EM is more reduced in FIG. 6 than in FIG. 5.

Figure 7:
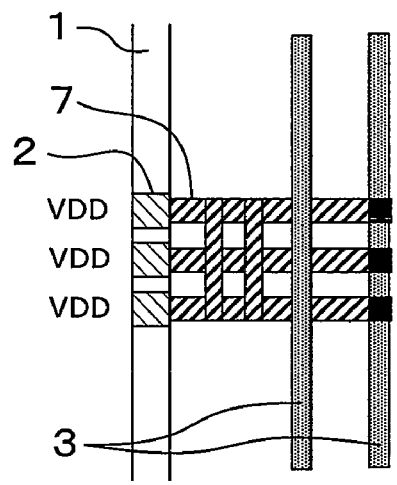
FIG. 7 is an enlarged plan view illustrating still another example of a ring power supply arrangement according to the invention.

FIG. 7 shows a wiring diagram in which three wires having the same potential are connected between the power supply IO and the ring power supply in mesh form. In this arrangement, the threshold current density is improved more than in the arrangement in which the power supply IO is connected with the ring power supply in one-to-one manner. Therefore, it is possible to reduce the incidence of EM.

Figure 8:
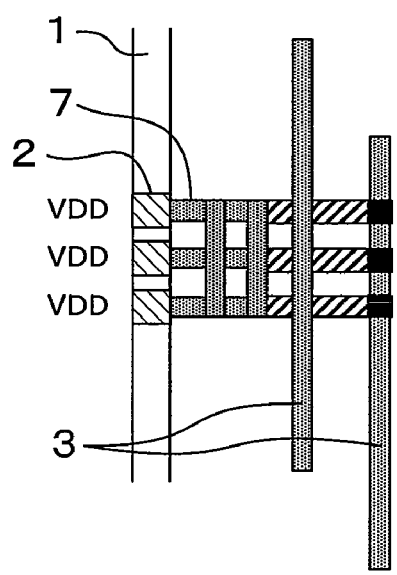
FIG. 8 is an enlarged plan view illustrating still another example of a ring power supply arrangement according to the invention.

In FIG. 8, the wire between the power supply IO and the ring power supply shown in FIG. 7 is lined with layers. This increases the threshold current density of the wire connected between the power supply IO and the ring power supply. Consequently, the incidence of EM is more reduced in FIG. 8 than in FIG. 7.

Figure 9:
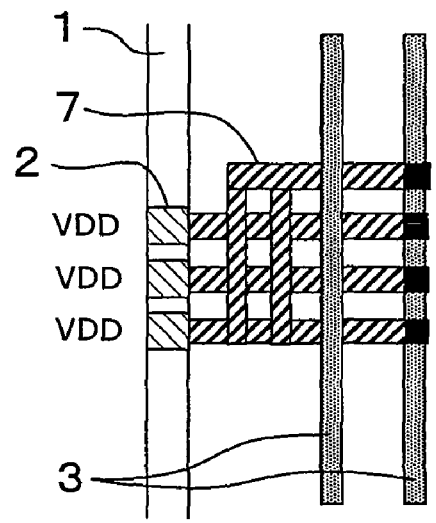
FIG. 9 is an enlarged plan view illustrating still another example of a ring power supply arrangement according to the invention.

FIG. 9 is a combination of the arrangements shown in FIG. 5 and FIG. 7. The power supply IO is connected with the ring power supply in one-to-two manner instead of one-to-one manner. That is, in the arrangement in FIG. 9, the current flow path is branched. Moreover, the wires between the power supply IO and the ring power supply are arranged in mesh form. This arrangement has a threshold current density higher than that of the arrangement in which the power supply IO is connected with the ring power supply in one-to-one manner. In this arrangement, it is possible to prevent concentration of the current flow on the ring power supply and to distribute the current flow. Consequently, it is possible to significantly reduce the incidence of EM.

Figure 10:
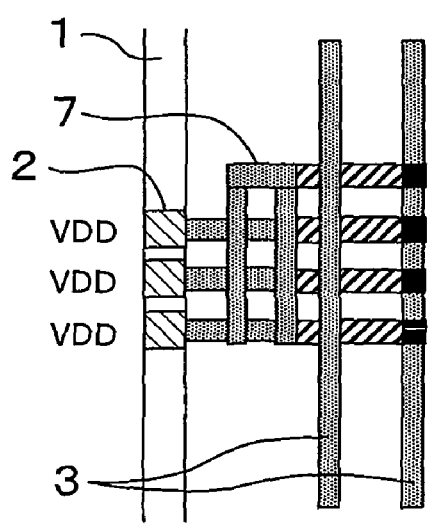
FIG. 10 is an enlarged plan view illustrating still another example of a ring power supply arrangement according to the invention.

In FIG. 10, the wire between the power supply IO and the ring power supply shown in FIG. 9 is lined with layers. The wire from the power supply IO to the ring power supply is lined with the layers, so that it is possible to improve the threshold current density of the wire between the power supply IO and the ring power supply. Consequently, the incidence of EM is more reduced in the arrangement in FIG. 10 than in the arrangement in FIG. 9.

In the arrangements shown in FIG. 6, FIG. 8, and FIG. 10, the wire 7 is lined with layers and connected by vias (not shown).

Figure 11:
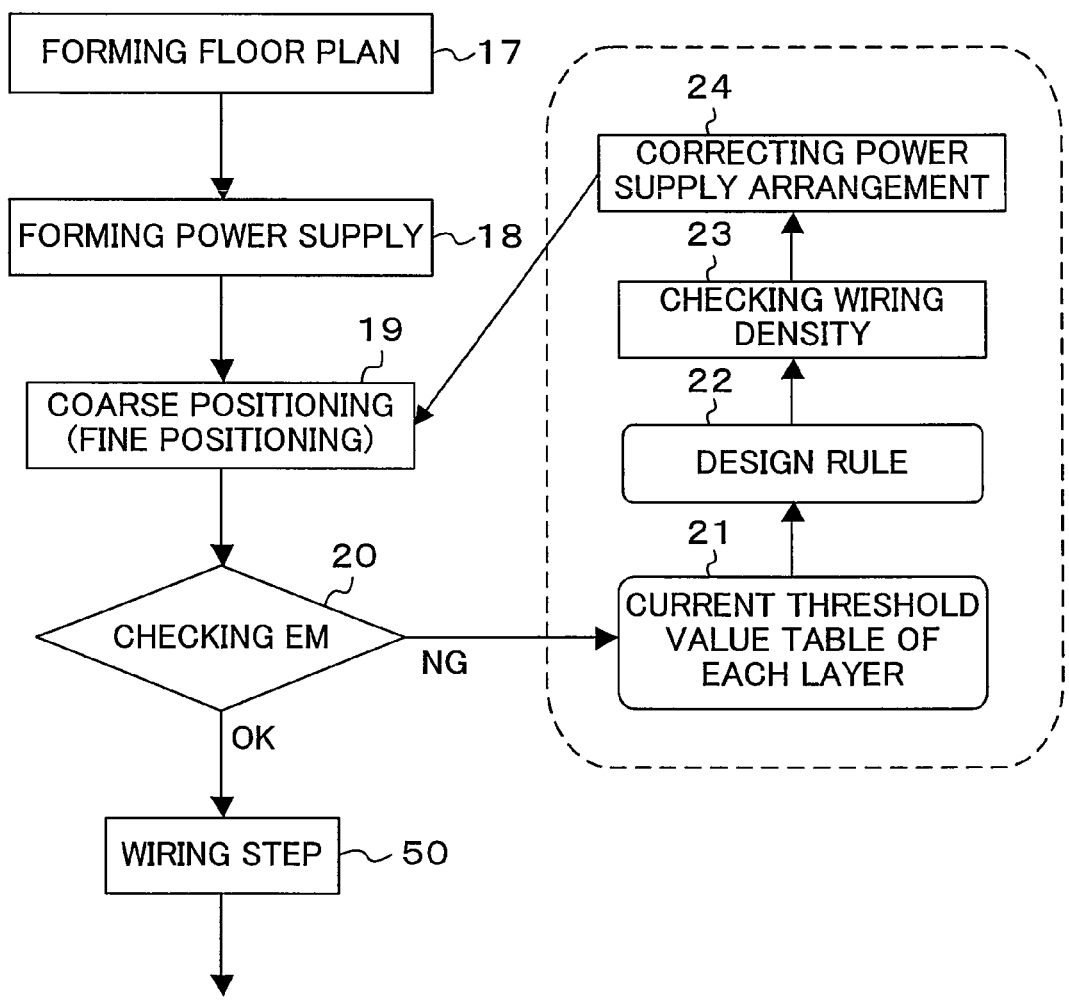
FIG. 11 is a design flow chart for a semiconductor integrated circuit according to the invention.

FIG. 11 is a design flow chart for a semiconductor integrated circuit in accordance with the present invention. FIG. 11 shows a floor plan forming step 17, a power supply forming step 18, a coarse positioning (fine positioning) step 19, an EM check step 20, a current threshold value table 21 of each layer, a design rule 22, a wiring density check step 23, a power supply arrangement correction step 24, and a wiring step 50. In FIG. 11, a power supply is first formed in step 18. Then, referring to the current threshold value table 21 of each layer, a current threshold value exceeding part of the layer is specified. The current threshold value table 21 and the design rule 22 are used to perform the wiring density check step 23. Next, in the power supply arrangement correction step 24, a power supply arrangement compliant with the current threshold value, the design rule, and the wiring density is realized. A specific example of the design method according to FIG. 11 is explained below.

Figure 12:
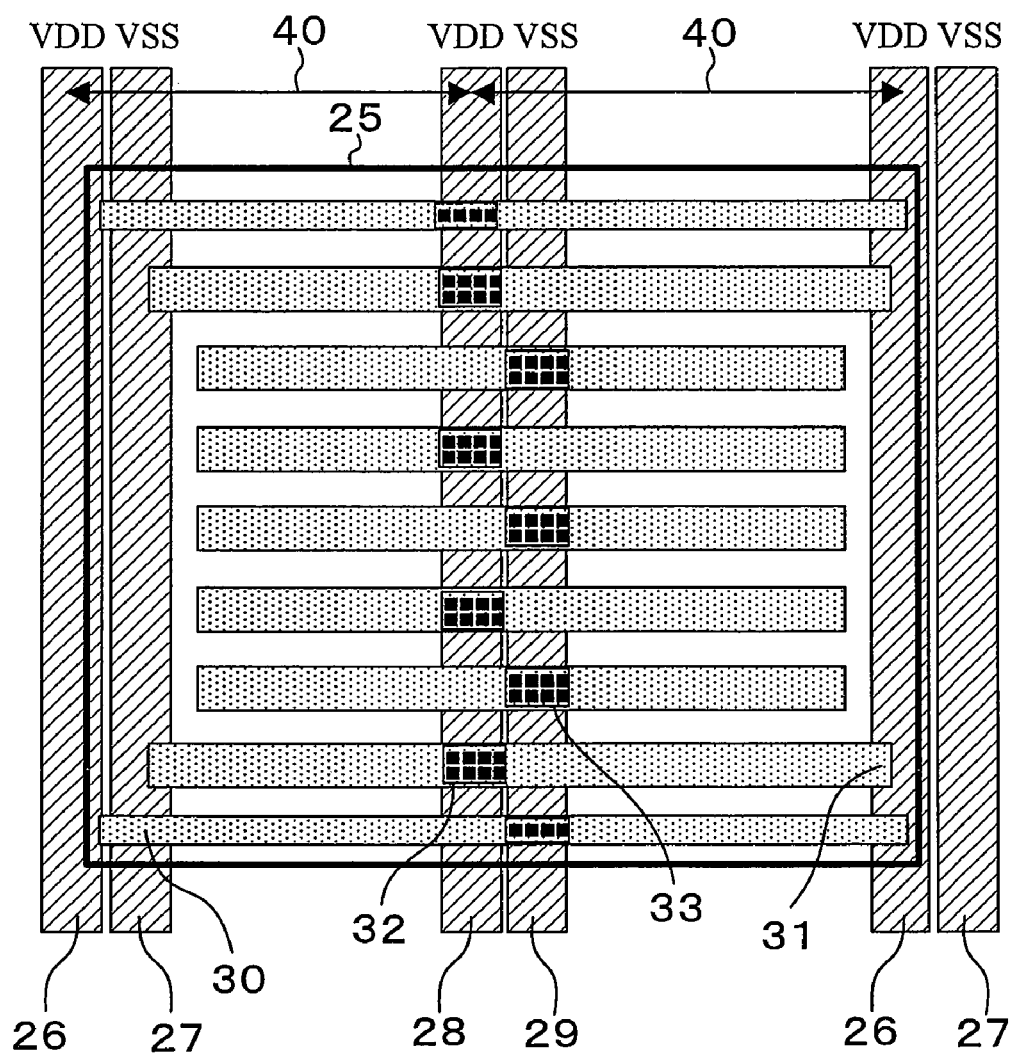
FIG. 12 is a plan view illustrating an example of a power supply designed according to the flow chart in FIG. 11.

FIG. 12 shows an example of a power supply designed according to the flow chart shown in FIG. 11. Referring to FIG. 12, a method is explained for connecting a power supply with an object, such as a block, a macro and IP, having its own internal power supply to be connected. FIG. 12 shows an outer frame 25 of a macro, mesh power supplies or strap power supplies 26-29 of a chip, power supply patterns 30 and 31 inside the macro, and contacts 32 and 33 connecting the power supplies of the chip with the power supply patterns inside the macro.

In FIG. 12, on the macro and on the IP, power supply wires 26 and 27 to be used in the chip are formed at a constant pitch 40. After forming the power supply wires and before forming the contact, a part having a possibility of the excess over the current threshold value is specified. In a part where only a contact incompliant with the current threshold value and the design rule can be formed (the power supply patterns 30 and 31 in the macro in FIG. 12), no contact is formed but a part in which the current threshold value is not exceeded (contacts 32 and 33 on the wires 28 and 29 in FIG. 12) is formed. According to this method, the parts 30 and 31 having a possibility of the excess over the current threshold value are eliminated in advance. Therefore, it is possible to reduce the worker-hour required for the subsequent steps of, for example, correcting the power supply and rearranging the wires due to the excess over the current threshold value.

Figure 13:
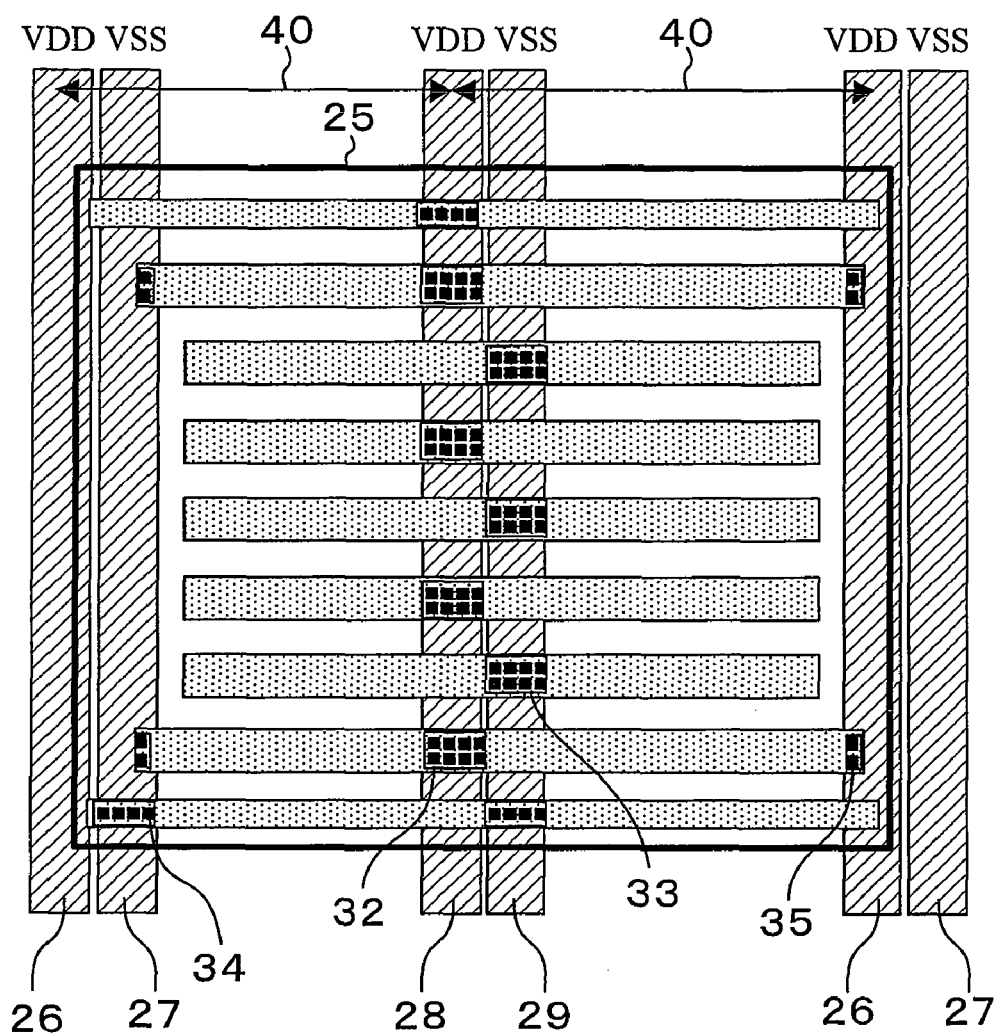
FIG. 13 is a plan view illustrating a power supply in the middle of the design process according to the flow chart in FIG. 11.
Figure 14:
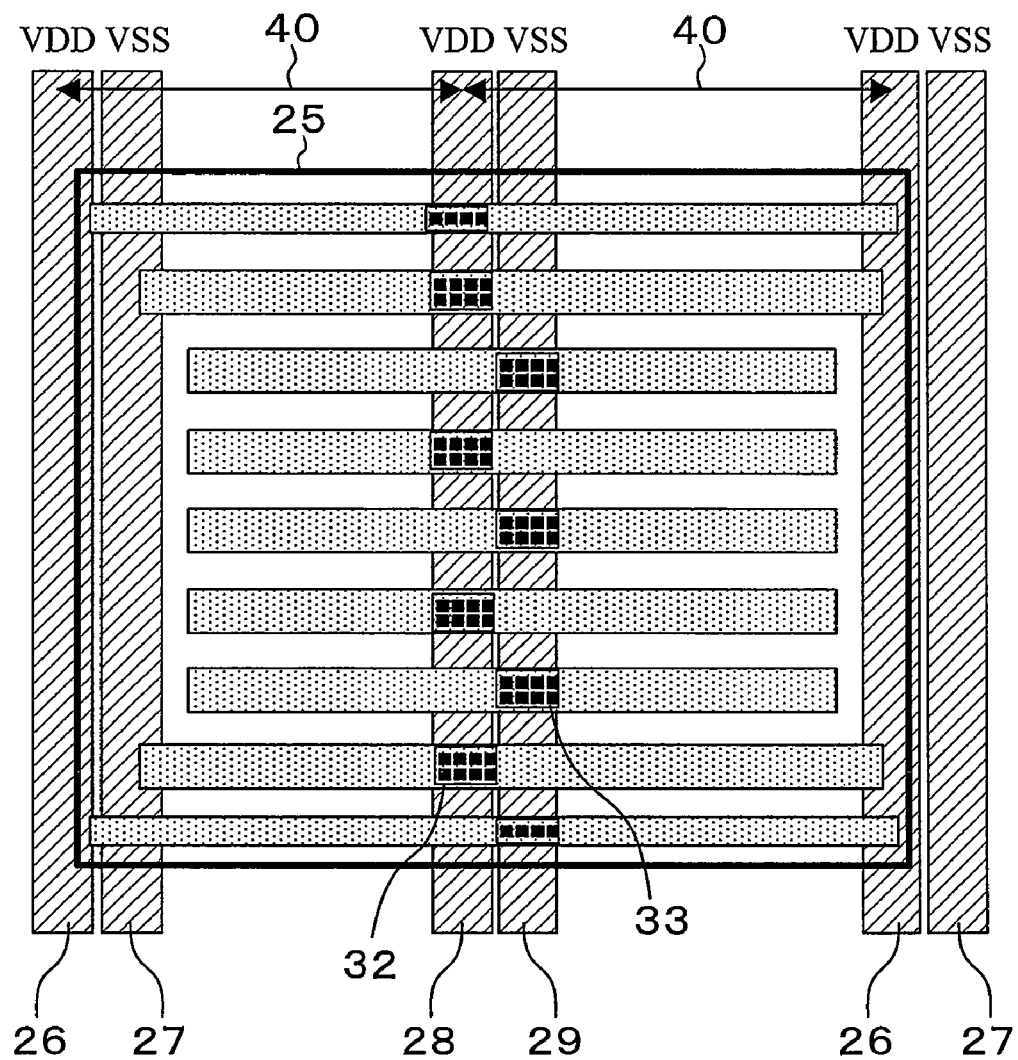
FIG. 14 is a plan view illustrating an arrangement of the power supply in FIG. 13 which is corrected according to the flow chart in FIG. 11.

FIG. 13 is a plan view illustrating a power supply in the middle of the design process according to the flow chart in FIG. 11. FIG. 14 shows an arrangement in FIG. 13 which is corrected according to the flow chart in FIG. 11. As shown in FIG. 13, the power supply wire is first formed, and then, contacts are provided for all connection points. Next, the flow chart shown in FIG. 11 is applied so as to delete contacts 34 and 35 causing the excess over the current threshold value and a contact causing a DRC error. The result is shown in FIG. 14. Compared with the method described with reference to FIG. 12, the method described with reference to FIG. 13 is effective when a layout has to be changed. That is, this method is effective for a part incompliant with the current threshold value or the design rule any longer, due to, for example, a change in an arrangement of the macro, power supply wiring rule, or current value caused by a layout change.

Figure 15:
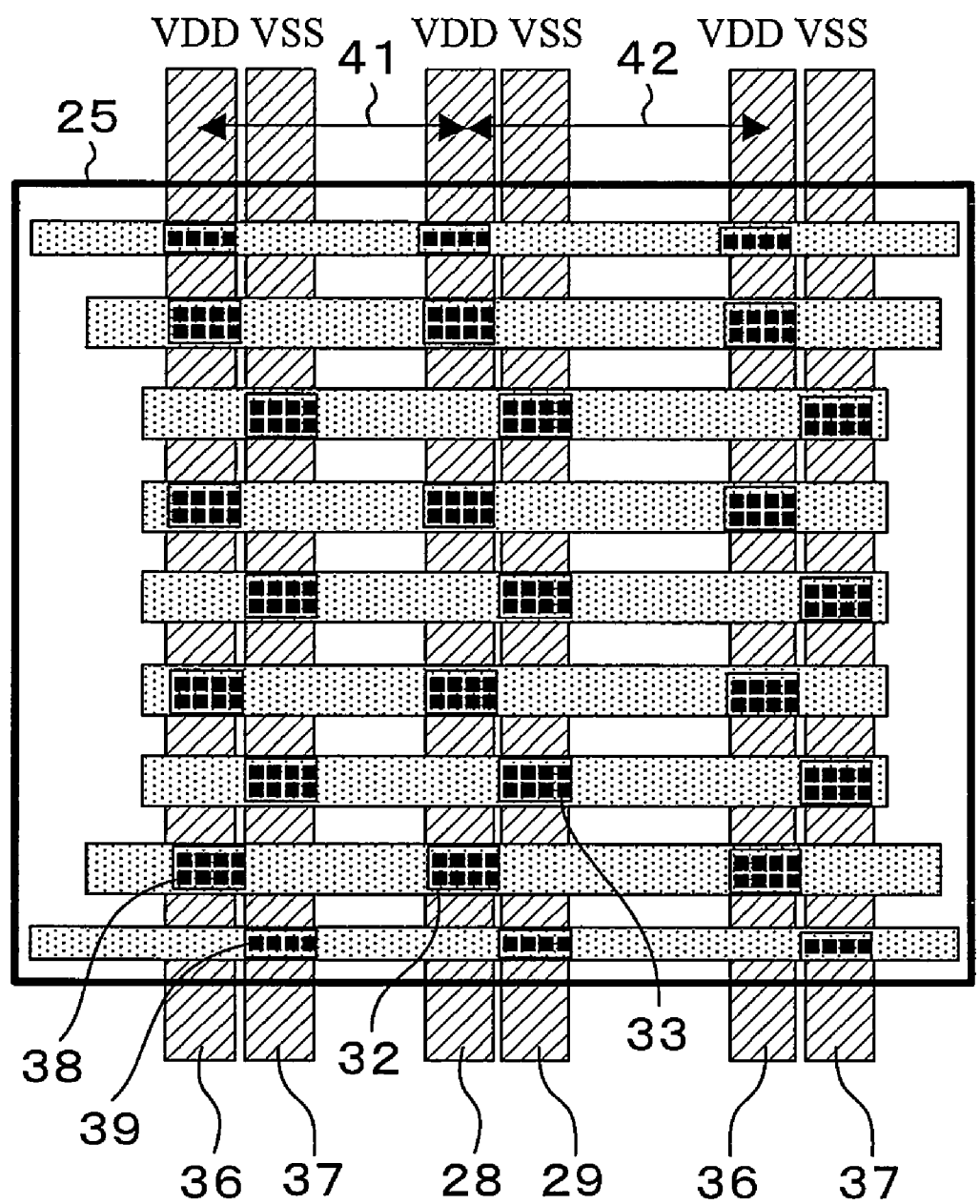
FIG. 15 is a plan view illustrating an arrangement of the power supply in FIG. 13 in which wiring pitch is changed according to the flow chart in FIG. 11.

FIG. 15 shows the arrangement in FIG. 13 whose wiring pitch is changed according the flow chart shown in FIG. 11. FIG. 15 shows changed chip power supply pitches 41 and 42, displaced chip power supplies 36 and 37, and contacts formed for the displaced chip power supplies 38 and 39.

When the above-mentioned measure does not eliminate a current threshold value exceeding part, the constant pitches (40 in FIG. 13) between the power supply wires (26 and 27 in FIG. 13) are changed so as to displace a chip-side power supply such that contacts compliant with the current threshold value can be formed (wires 36 and 37 in FIG. 15). This method enables to eliminate contacts (34 and 35 in FIG. 13) having a high incidence of EM, while sufficient power is supplied from the power supply to be used in the chip to the macro and the IP. It is not necessary that the changed chip power supply pitches 41 and 42 are the same.

Figure 16:
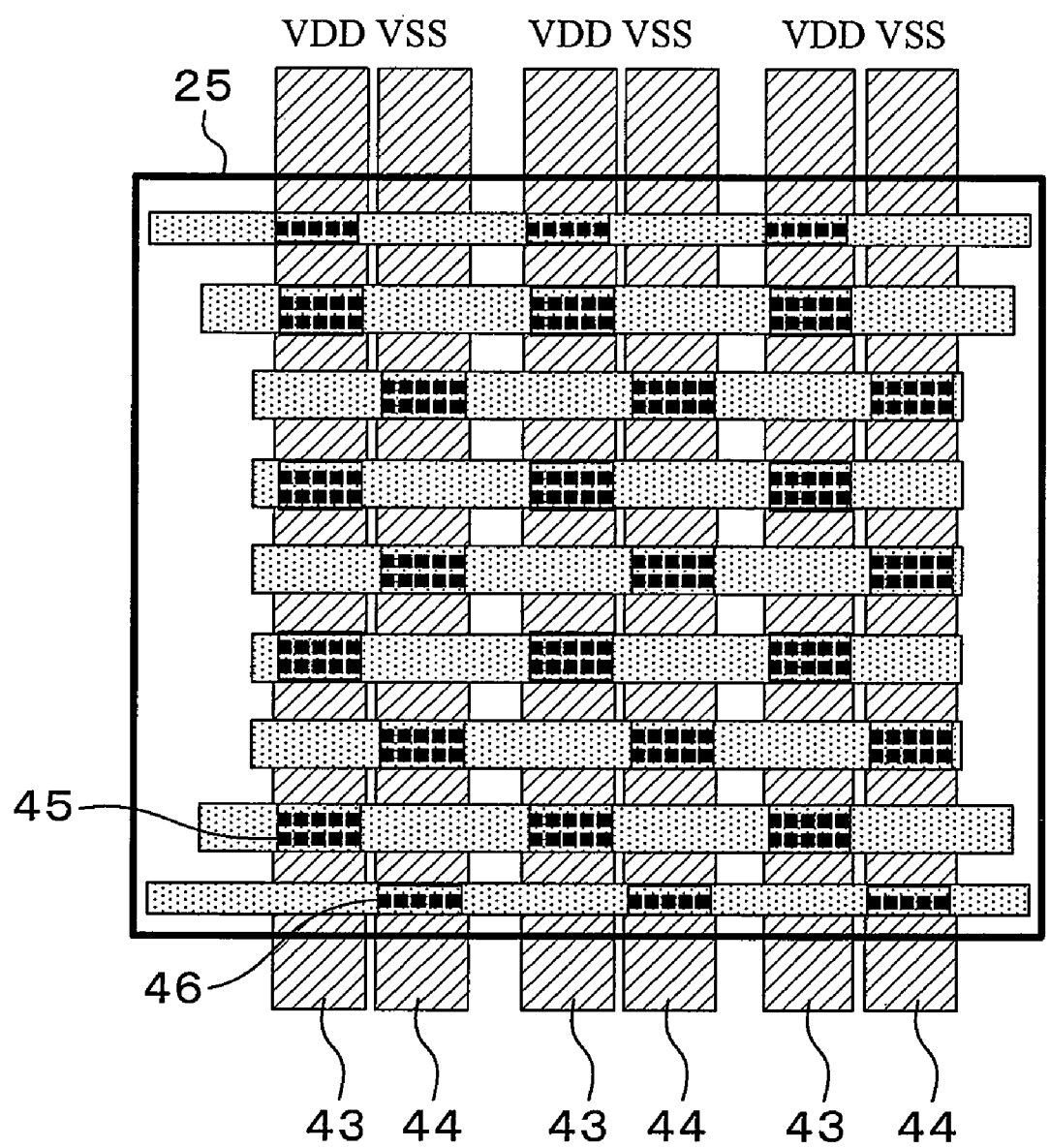
FIG. 16 is a plan view illustrating an arrangement of the power supply shown in FIG. 15 in which wire width is changed according to the flow chart in FIG. 11.

In an arrangement shown in FIG. 16, the wire width shown in FIG. 15 is changed according to the flow chart shown in FIG. 11. When the above-mentioned measure does not eliminate a current threshold value exceeding part, the width of wires (36, 37, 28, and 29 in FIG. 15) is broadened (as indicated by reference numbers 43 and 44 in FIG. 16). In addition to broadening the wire width, the total number of contacts is increased (from the number of contacts indicated by reference numbers 38 and 39 in FIG. 15 to the number of contacts indicated by reference numbers 45 and 46 in FIG. 16). According to this method, it is possible to reduce the worker-hour required for the steps of reducing the incidence of EM, improving power supply to the macro or IP, correcting the power supply and rearranging the wires in a case where the current threshold value is exceeded.

In the conventional art, a specification for the wiring density is checked in a subsequent step. However, according to the flow chart shown in FIG. 11, the specification is checked in the wiring density check step 23 in advance. Consequently, a repeat step is omitted.

As described above, a semiconductor integrated circuit and a design method thereof according to the present invention allow reduction of the incidence of EM with the reduced worker-hour required for the design method, so that the semiconductor integrated circuit and the design method of the present invention find utility, for example, in a semiconductor integrated circuit having a multilayer interconnection configuration, and in the layout design thereof.

What is claimed is:

1. A semiconductor integrated circuit comprising:
   a first power supply source IO terminal;
   a first power supply source wire; and
   a first ring power supply, wherein:
   the first power supply source IO terminal is connected to the first power supply source wire,
   the first power supply source wire is connected to the first ring power supply,
   the first power supply source wire includes a first branched wire, and
   the first branched wire is connected to the first ring power supply.

2. The semiconductor integrated circuit of claim 1, wherein each of the first power supply source wire and the first branched wire includes a plurality of wire layers.

3. The semiconductor integrated circuit of claim 2, further comprising:
   a second ring power supply;
   a third power supply source wire; and
   a third power supply source IO terminal, wherein:
   each of the first ring power supply and the second ring power supply includes a plurality of wire layers,
   the first ring power supply is connected to the first power supply source wire in at least one of the plurality of wire layers,
   the second ring power supply is connected to the third power supply source wire in at least one of the plurality of wire layers,
   the third power supply source IO terminal is connected to the third power supply source wire,
   the first power supply source IO terminal and the third power supply source IO terminal in a pair are disposed outside the first ring power supply and the second ring power supply in a pair when viewed in plan, and
   the wire layers of the first power supply source wire and the third power supply source wire are the same wire layer.

4. The semiconductor integrated circuit of claim 1, further comprising:
   a second power supply source IO terminal; and
   a second power supply source wire, wherein:
   the second power supply source IO terminal is connected to the second power supply source wire, and
   the second power supply source wire is connected to the first ring power supply and the first branched wire.

5. The semiconductor integrated circuit of claim 4, wherein the second power supply source wire includes a plurality of wire layers.

6. The semiconductor integrated circuit of claim 5, further comprising:
   a second ring power supply;
   a third power supply source wire; and
   a third power supply source IO terminal, wherein:
   each of the first ring power supply and the second ring power supply includes a plurality of wire layers,
   the first ring power supply is connected to the first power supply source wire in at least one of the plurality of wire layers,
   the second ring power supply is connected to the third power supply source wire in at least one of the plurality of wire layers,
   the third power supply source IO terminal is connected to the third power supply source wire,
   the first power supply source IO terminal and the third power supply source IO terminal in a pair are disposed outside the first ring power supply and the second ring power supply in a pair when viewed in plan, and
   the wire layers of the first power supply source wire and the third power supply source wire are the same wire layer.

7. The semiconductor integrated circuit of claim 4, wherein:
   the first power supply source wire further includes a second branched wire, and
   the second power supply source wire is connected to the second branched wire.

8. The semiconductor integrated circuit of claim 7, wherein each of the second power supply source wire and the second branched wire includes a plurality of wire layers.

9. The semiconductor integrated circuit of claim 8, further comprising:
   a second ring power supply;
   a third power supply source wire; and
   a third power supply source IO terminal, wherein:
   each of the first ring power supply and the second ring power supply includes a plurality of wire layers,
   the first ring power supply is connected to the first power supply source wire in at least one of the plurality of wire layers,
   the second ring power supply is connected to the third power supply source wire in at least one of the plurality of wire layers,
   the third power supply source IO terminal is connected to the third power supply source wire,
   the first power supply source IO terminal and the third power supply source IO terminal in a pair are disposed outside the first ring power supply and the second ring power supply in a pair when viewed in plan, and
   the wire layers of the first power supply source wire and the third power supply source wire are the same wire layer.

10. The semiconductor integrated circuit of claim 4, further comprising:
    a second ring power supply;
    a third power supply source wire; and
    a third power supply source IO terminal, wherein:
    each of the first ring power supply and the second ring power supply includes a plurality of wire layers,
    the first ring power supply is connected to the first power supply source wire in at least one of the plurality of wire layers,
    the second ring power supply is connected to the third power supply source wire in at least one of the plurality of wire layers,
    the third power supply source IO terminal is connected to the third power supply source wire, the first power supply source IO terminal and the third power supply source IO terminal in a pair are disposed outside the first ring power supply and the second ring power supply in a pair when viewed in plan, and the wire layers of the first power supply source wire and the third power supply source wire are the same wire layer.

11. The semiconductor integrated circuit of claim 7, further comprising:

a second ring power supply;

a third power supply source wire; and a third power supply source IO terminal, wherein:

each of the first ring power supply and the second ring power supply includes a plurality of wire layers, the first ring power supply is connected to the first power supply source wire in at least one of the plurality of wire layers, the second ring power supply is connected to the third power supply source wire in at least one of the plurality of wire layers, the third power supply source IO terminal is connected to the third power supply source wire, the first power supply source IO terminal and the third power supply source IO terminal in a pair are disposed outside the first ring power supply and the second ring power supply in a pair when viewed in plan, and the wire layers of the first power supply source wire and the third power supply source wire are the same wire layer.

12. The semiconductor integrated circuit of claim 4, wherein a total number of connection points of the first power supply source wire to the first ring power supply, connection points of the second power supply source wire to the first ring power supply, and connection points of the first branched wire to the first ring power supply is larger than a total number of the first power supply source IO terminal and the second power supply source IO terminal.

13. The semiconductor integrated circuit of claim 12, wherein the second power supply source wire includes a plurality of wire layers.

14. The semiconductor integrated circuit of claim 13, further comprising:

a second ring power supply;

a third power supply source wire; and a third power supply source IO terminal, wherein:

each of the first ring power supply and the second ring power supply includes a plurality of wire layers, the first ring power supply is connected to the first power supply source wire in at least one of the plurality of wire layers, the second ring power supply is connected to the third power supply source wire in at least one of the plurality of wire layers, the third power supply source IO terminal is connected to the third power supply source wire, the first power supply source IO terminal and the third power supply source IO terminal in a pair are disposed outside the first ring power supply and the second ring power supply in a pair when viewed in plan, and the wire layers of the first power supply source wire and the third power supply source wire are the same wire layer.

15. The semiconductor integrated circuit of claim 12, wherein:

the first power supply source wire further includes a second branched wire, and the second power supply source wire is connected to the second branched wire.

16. The semiconductor integrated circuit of claim 15, wherein each of the second power supply source wire and the second branched wire includes a plurality of wire layers.

17. The semiconductor integrated circuit of claim 16, further comprising:

a second ring power supply;

a third power supply source wire; and a third power supply source IO terminal, wherein:

each of the first ring power supply and the second ring power supply includes a plurality of wire layers, the first ring power supply is connected to the first power supply source wire in at least one of the plurality of wire layers, the second ring power supply is connected to the third power supply source wire in at least one of the plurality of wire layers, the third power supply source IO terminal is connected to the third power supply source wire, the first power supply source IO terminal and the third power supply source IO terminal in a pair are disposed outside the first ring power supply and the second ring power supply in a pair when viewed in plan, and the wire layers of the first power supply source wire and the third power supply source wire are the same wire layer.

18. The semiconductor integrated circuit of claim 15, further comprising:

a second ring power supply;

a third power supply source wire; and a third power supply source IO terminal, wherein:

each of the first ring power supply and the second ring power supply includes a plurality of wire layers, the first ring power supply is connected to the first power supply source wire in at least one of the plurality of wire layers, the second ring power supply is connected to the third power supply source wire in at least one of the plurality of wire layers, the third power supply source IO terminal is connected to the third power supply source wire, the first power supply source IO terminal and the third power supply source IO terminal in a pair are disposed outside the first ring power supply and the second ring power supply in a pair when viewed in plan, and the wire layers of the first power supply source wire and the third power supply source wire are the same wire layer.

19. The semiconductor integrated circuit of claim 12, further comprising:

a second ring power supply;

a third power supply source wire; and a third power supply source IO terminal, wherein:

each of the first ring power supply and the second ring power supply includes a plurality of wire layers, the first ring power supply is connected to the first power supply source wire in at least one of the plurality of wire layers, the second ring power supply is connected to the third power supply source wire in at least one of the plurality of wire layers, the third power supply source IO terminal is connected to the third power supply source wire, the first power supply source IO terminal and the third power supply source IO terminal in a pair are disposed outside the first ring power supply and the second ring power supply in a pair when viewed in plan, and the wire layers of the first power supply source wire and the third power supply source wire are the same wire layer.

20. The semiconductor integrated circuit of claim 1, further comprising:
a second ring power supply;
a third power supply source wire; and
a third power supply source IO terminal, wherein:
each of the first ring power supply and the second ring power supply includes a plurality of wire layers,
the first ring power supply is connected to the first power supply source wire in at least one of the plurality of wire layers,
the second ring power supply is connected to the third power supply source wire in at least one of the plurality of wire layers,
the third power supply source IO terminal is connected to the third power supply source wire,
the first power supply source IO terminal and the third power supply source IO terminal in a pair are disposed outside the first ring power supply and the second ring power supply in a pair when viewed in plan, and
the wire layers of the first power supply source wire and the third power supply source wire are the same wire layer.

* * * * *